June 17, 1969 R. W. DICK 3,450,901
SEQUENCING CIRCUIT
Filed April 11, 1966
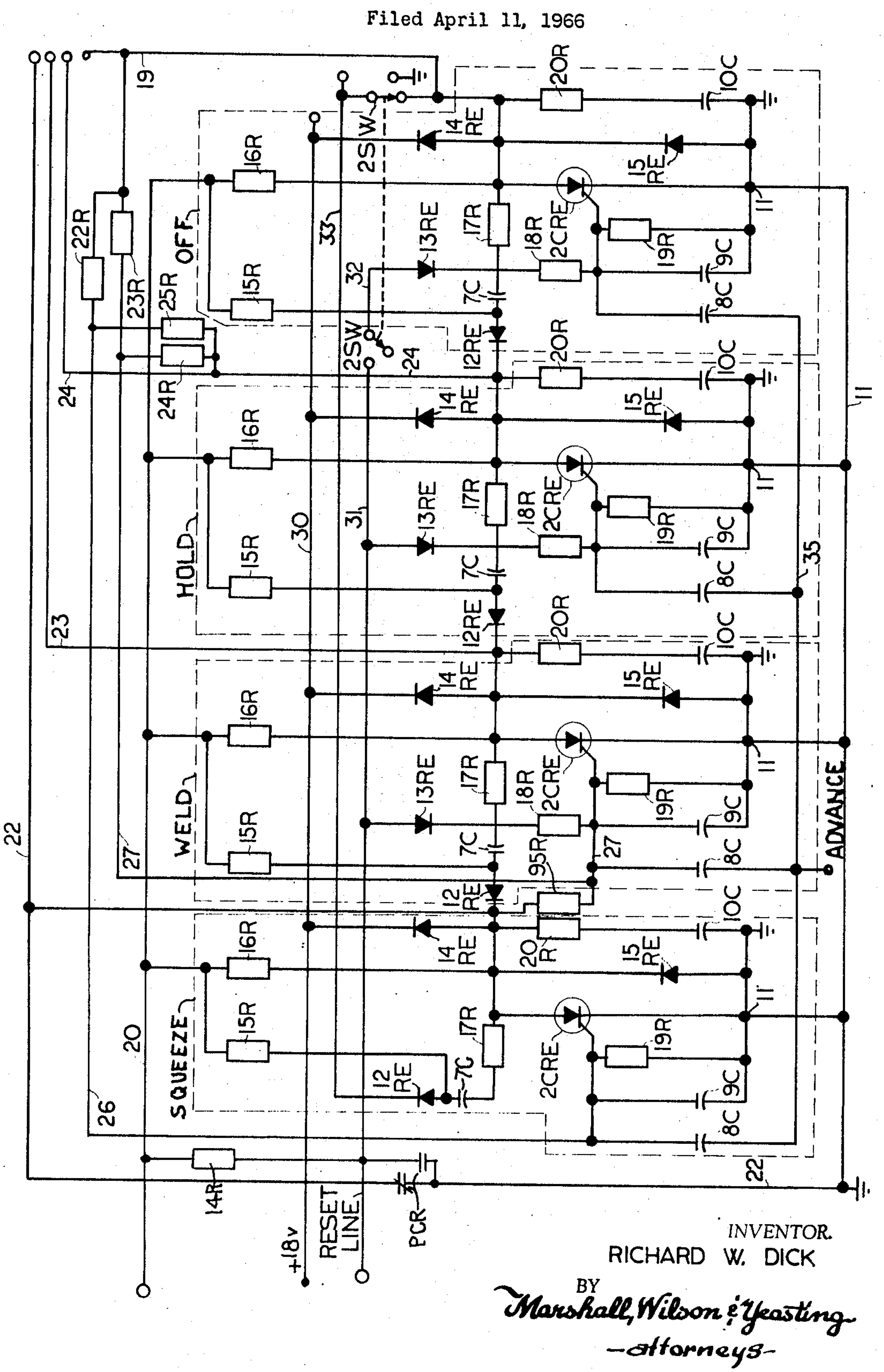
INVENTOR.
RICHARD W. DICK
BY Marshall, Wilson & Yeasting
Attorneys United States Patent Office 3,450,901
Patented June 17, 1969

3,450,901
SEQUENCING CIRCUIT

Richard W. Dick, Redford Township, Wayne County, Mich., assignor to Weltronic Company, Southfield, Mich., a corporation of Michigan Filed Apr. 11, 1966, Ser. No. 541,658
Int. Cl. H03k *17/60*
U.S. Cl. 307—252 8 Claims This invention relates to improved sequencing circuits, improved ring counters and particularly improvements upon the ring counter in the copending U.S. Patent application Ser. No. 381,065, filed July 8, 1964 for "Ring Counter" in the name of Bobby Gene Hubbard, now Patent No. 3,404,287.

In the aforenoted ring counter a plurality of stages, each including a valve element are coupled in sequence and arranged such that a stage is active when the valve is in an "off" or nonconductive condition. The counter is arranged so that at least those stages adjacent the operating stage have their valves in an "on" or conductive condition. In many applications but one stage is operated at any given time, hence all but that stage have their valves "on." However utilizations have been proposed wherein two or more stages are operated simultaneously wherein the operated stages have their valves "off" and stages adjacent the operated stages have their valves "on."

In the Hubbard ring counter transfer pulses are applied to pulse the operating stage valve "on." The turnon of the stage sets the next succeeding stage in operation by terminating conduction in its valve. Coupling between the stages is by means of capacitors and diodes between the respective anodes of the valves. The scheme proposed by Hubbard employed semiconductive controlled rectifiers as the valves. However it is to be appreciated that gas tubes such as thyratrons can also be employed. In the following discussion reference will be made to silicon controlled rectifiers as "SCR's." In the Hubbard circuit made up of elements having the proper parameters, as an operating stage SCR begins to conduct the potential of the anode of the SCR of the next stage is reduced below the sustaining level and the SCR is turned "off." However commutation in this circuit is very critical. If its parameters are not carefully set, it is subject to a false transfer of the count through a plurality of commutating capacitors in series so that several successive stages have their valve rendered non-conductive. This indicates a plurality of "on" stages.

In those applications where only a single stage is to be operating at any given time, the counter at the time of turnon can have stages at random locations with their valves off. This results in one stage intentionally set in the operating state and one or more other stages similarly set. Under these conditions, the application of transfer pulses through a circuit common to all stages advance the stages next adjacent to the operating stages into the operating state. Again this impairs the reliability of the circuit.

An object of the present invention is to improve sequencing circuits.

Another object is to increase the reliability of sequencing circuits.

A third object is to reduce the degree of criticalness of components in a sequencing circuit with a resultant decrease in the cost and increase in reliability of such circuits.

A fourth object is to insure against double advances in response to application of an advance signal in a sequencing circuit.

A fifth object is to avoid false operation upon initiation of operation of a sequencing circuit.

The invention achieves the above objects in a ring counter comprising a plurality of cascaded stages having silicon controlled rectifiers with their anodes coupled through commutating circuits including a unilateral conductor, a capacitor and a commutating impedance. The capacitor is connected to a charging circuit coupled to the capacitor between it and the unilateral conducting device to the anode of the preceding stage whereby the non-conductive state of the preceding stage permits a charge to be developed on the capacitor. The SCR of the operating stage is non-conducting while those of all other stages are conducting. Advance signals are applied to all stages of this counter through the control electrode of the SCR to turn on the operating stage and through the discharge of the capacitance reduce the anode potential of the succeeding stage below its sustaining level.

A feature of this invention resides in the commutating impedance between each stage which is of a defined value small compared to the load impedance for the stage.

A feature of this invention involves clamping the anode of the valve for each counter stage to ground through a diode whereby the second succeeding and subsequent stages of the counter are not affected by the turnon of the operating stage valve to discharge the capacitor which extinguishes the following stage and only the valve of the next suceeding stage is extinguished.

Another feature involves arranging the time constant of the commutating circuit between stages to be long compared to the turnoff time of the valve and to the transfer pulse to insure that the valve of the stage to be placed in operation has its anode held below the level necessary to place it in conduction while its control electrode is subject to the firing impulse of the commonly applied transfer pulse.

A further feature is the use of feedback from certain stages to the gates of other stages to prevent unwanted stable conditions from occurring such that incorrect stages have their valves "off'.

The above and additional objects and features will be more fully appreciated from the folowing detailed description when read with reference to the schematic circuit diagram of a four stage counter according to the present invention.

At the outset the similarity between the four illustrated stages of the counter, each as encompassed by dashed lines, should be noted. In view of this similarity corresponding elements have been assigned identical reference characters.

A typical application of the counter is in control of a resistance welding sequence involving a "squeeze cycle" to close the welding electrodes upon the workpiece, a "weld cycle" in which welding current is passed through the electrodes and workpiece, a "hold cycle" in which electrode pressure is maintained upon the workpiece while the material fused during the "weld cycle" is cooled and, when repetitive operations are required, an "off cycle" to provide a time spacing between the "hold cycle" and the "squeeze cycle" of the following weld. In the example of the drawing each stages has been labeled for these welding functions. Times for each operation cycle and the functions to be performed during that cycle (by means not shown) are derived for each stage of the counter from leads 22, 23, 24 and 19 for "squeeze," "weld," "hold" and "off" cycles respectively as sensed from load resistor 16R. Reset of stages "weld," "hold" and "off" is provided through lead 31 to diode 13RE and resistor 18R to the control electrode of 2CRE and to ground through the parallel combination of capacitor 9C and resistor 19R. Capacitor 9C is a noise suppressor. The series combination of resistor 20R and 10C is utilized to avoid firing the SCR by steep rise anode-cathode signals.

Each stage of the counter utilizes a silicon controlled rectifier 2CRE as the valve or gated element having its anode supplied from a suitable source of positive potential such as +45 volts applied to line 20 through load resistor 16R. The cathode of 2CRE is grounded and its gate or control electrode is connected through coupling capacitor 8C and lead 35 to an advance pulse input terminal. The stages are commutated through a rectifier 12RE a capacitor 7C and a commutating impedance, resistor 17R, connected in series between anodes of the SCR's of adjacent stages. A charging path is provided for capacitor 7C from supply lead 20 through resistor 15R.

As mentioned above the counter maintains all stages conductive but the operative or active stage. In initially placing the counter in operation, a positive signal is applied to lead 20 and is effective through resistor 16R upon all anodes of the SCR's, 2CRE, except the "squeeze" stage which has its anode grounded through lead 22 and normally closed contact PCR. The system illustrated is selectively arranged for either of two operating sequences depending upon the condition of the ganged repeat- no repeat switch 2SW which is shown in the repeat setting in the drawing. First consider the operation with switch 2SW set for no repeat operation wherein only the sequence "squeeze," "weld" and "hold" occurs in response to an initiating action. With this setting leads 31 and 32 are connected and lead 33 is grounded. With these settings and power applied to lead 20 a suitable positive gating signal is also applied to the control electrodes of the SCRs and 2CRE of each stage but the "squeeze stage" to place those stages in a conducting state. This signal is derived from lead 20 through resistor 14R to reset line 31 and thence through rectifiers 13RE and resistors 18R to the gate electrode and to ground through resistor 19R. Thus the "squeeze" stage is off and all other stages are on.

Initiation of the sequencing operation controlled by the timer is accomplished by pulling in relay PCR (not shown) to open its back contact in lead 22 and closing its front contact to ground reset line 31. This removes the ground on the anode of the "squeeze" 2CRE and permits it to assume an operative potential. "Squeeze" functions are initiated in response to this signal and the squeeze time interval is initiated. At this time "squeeze" 2CRE is "off," all other 2CRE's are on and the "weld" capacitor 7C is charged from lead 20, through resistor 15R, capacitor 7C, resistor 17R and "weld" 2CRE to ground.

When the "squeeze time" expires a positive going advance pulse is applied to lead 35 and through capacitors 8C to all control electrodes. The "off" stage is responsive to the advance pulse common to all stages to turn "on" the "squeeze stage." With 2CRE conductive in the "squeeze stage," 7C in the weld stage is grounded through rectifier diode 12RE and 2CRE. Capacitor 7C now discharges through diode 12RE and 2CRE to ground through diode 15RE and resistor 17R of the "weld stage." This causes the anode voltage of 2CRE in the "weld stage" to rapidly transfer to the forward drop of 15RE or about 0.7 volt negative to terminate conduction in the SCR. This anode voltage is held for a suitable interval, 50 microseconds in the example, to insure that it exceeds the turnoff time of the SCR and the duration of the common advance pulse on lead 35. Thereafter, capacitor 7C is recharged in the opposite direction than previously. The charge is from the 45 volts positive value on line 20 as applied through its resistor 16R and also through the next stage resistor 15R and diode 12RE to the "weld stage" diode 12RE and "squeeze stage" SCR 2CRE to ground.

Thus the forward drop of diode 15RE during the discharge of the capacitor 7C of its stage imposes a negative clamp on the anode of its 2CRE which is sufficient to avoid imposing a forward bias on the diode 12RE of the next succeeding stage, the "hold stage," and which prevents reducing the anode voltage to the turn off level for that next stage.

Further the R-C time constant of the combination of capacitance 7C and resistor 17R for a stage which is being turned off is chosen to exceed the turn off time of the SCR of that stage thereby insuring that it is turned "off" and the stage is rendered active. In the exemplary circuit the valves 2CRE are C6F silicon controlled rectifiers, the capacitors 7C are 0.5 microfarad, commutating resistors 17R are 100 ohms, load resistors 16R and resistors 15R are 2.7 kilo-ohms, and diodes 12RE to 15RE are 1N462A silicon rectifiers.

Output signals are derived from the anodes of the 2CRE of each stage. During the "squeeze cycle" lead 22 is thus at the anode potential. At other times the anode potential of 2CRE in the "squeeze" stage is essentially at ground.

The functions of squeeze, weld and hold are performed and timed in sequence while the appropriately labeled stages are active. If but a single weld is to be produced, ganged switch is positioned to couple leads 31 and 32 and to ground lead 33. Thus "off cycle" stage is made conductive during reset from lead 31, its output is decoupled from the "squeeze stage" and the "squeeze" commutating circuit is grounded. As "off cycle" stage is made effective, it issues a signal on lead 19 to apparatus (not shown) which terminates the weld operation.

If repetitive welds are to be performed, the counter ring is closed upon itself by positioning the switch 2SW as shown so that the output lead from the anode of the "off cycle" stage is coupled to the commutating circuit of the "squeeze stage" at lead 33. Switch 2SW opens the reset line between leads 31 and 32 so that the "off cycle" can run while the pilot control relay is dropped to apply a reset signal to lead 31 thereto. This relationship between operation of the pilot relay and off time is dictated by safety requirements.

When switch 2SW is in the position shown at the initiation of applied power no reset is transmitted to lead 32 hence the "off stage" remains nonconductive and imposes a signal on the gate of the "squeeze" and "weld" stages through lead 19 and the direct coupling afforded by resistor 22R and lead 26 to "squeeze" gate and by resistor 23R and lead 27 to "weld" gate. At the time the pilot relay is pulled to apply voltage to the "squeeze" anode, the "squeeze" stage becomes conductive due to the feedback on lead 26, however the "weld" stage cannot become nonconductive for an effective interval since upon restoration of its anode potential following discharge of its commutating capacitor it also is held on by the feedback on lead 27. Thus initially under these conditions the "off" stage is conductive and all other stages are conductive. The associated controls in their initial operation also issue an advance pulse subsequent to the operation of the pilot control relay (by means not shown) to cause "off stage" to become conductive thereby permitting "squeeze stage" commutating capacitor 7C to discharge through lead 33 and transfer its 2CRE to the nonconductive state. Thereafter the cycle is initiated with the "squeeze stage" nonconductive under the influence of pilot control relay PCR.

False operation in the counter is further suppressed by several direct coupled paths which impose the positive anode potential of a nonconducting stage on the gate of one or more other stages to insure conduction in those stages. For example, on occasion the contacts PCR may bounce and falsely tend to transfer the weld stage to a nonconductive state at the initiation of the weld operation. This is avoided by the coupling through resistor 95R from the anode of 2CRE in the nonconducting "squeeze" stage to lead 27 and the gate of the "weld" stage 2CRE. Similarly it is imperative that no "squeeze" or "weld" function occur during either the "hold or "off" cycles and coupling is provided to prevent this. Hold stage is coupled from its 2CRE anode through resistor 24R and lead 27 to the gate of "weld" stage and through resistor 25R and lead 26 to the gate of "squeeze" stage. The coupling from "off" stage through resistors 23R and 22R has been reviewed previously.

From the above it is evident that a commutating circuit has been provided between like power electrodes of bistable current conductors which insures the transfer from a conducting state to a nonconducting state of one bistable conductor when another nonconducting bistable conductor coupled thereto by the commutating circuit is transferred to a conductive state. Further that an advantageous commutating circuit includes resistance and capacitance with a time constant exceeding the turnoff time of the valve or bistable current conductor. These elements are augmented by a unidirectional conductive element, the diode 15RE, in parallel with the valve, 2CRE, arranged to pass current when the current flow in the commutating circuit tends to exceed the current flow in the load impedance, resistor 16R, of the stage being commutated to its non-conducting state whereby succeeding stages are not required to supply current and thereby reduce the anode potential of their valves.

Having described the invention, I claim:

1. In a sequencing circuit, in combination, a plurality of stages arranged in sequence; each stage comprising a bistable current conductor having a conducting state and a nonconducting state, said conductor having a first power electrode, a second power electrode, and a control electrode; a load impedance arranged in series circuit with the bistable conductor and connected to the first power electrode; means connected to the control electrodes for momentarily rendering the conductor of each stage conducting; a commutating circuit comprising in series a unilateral conductor, a capacitor, and a commutating impedance connected between the first power electrode of one stage and the first power electrode of the next stage in sequence, said commutating circuit having an impedance that is small compared to said load impedance; and a charging circuit connected to said capacitor and tending to maintain a charge on said capacitor.

2. A sequencing circuit according to claim 1 in which said charging circuit comprises a charging impedance and in which the series combination of said charging impedance, said capacitor and said commutating impedance is connected in parallel with the load impedance of a stage to be commutated to a non-conducting state by the onset of conduction in a preceding stage.

3. In a sequencing circuit according to claim 1 a unilateral conducting device connected in parallel with each bistable conductor arranged to pass current when the current flow in said commutating circuit tends to exceed the current flow in the load impedance of the stage being commutated to its non-conducting state.

4. A sequencing circuit according to claim 1 in which each bistable conductor is a silicon controlled rectifier.

5. A sequencing circuit according to claim 1 having a conductive circuit including a current limiting impedance from the first power electrode of one stage to the control electrode of another stage whereby a state of nonconduction in said one stage ensures a state of conduction in said another stage.

6. A sequencing circuit according to claim 1 in which said commutating impedance comprises a resistor.

7. A sequencing circuit according to claim 6 in which the time constant of said capacitor and said resistor exceeds the turn-off time of said bistable current conductor.

8. A sequencing circuit according to claim 1 in which said unilateral conductor is poled to conduct in a direction opposite the sequence of transfer of bistable current conductors from the conductive to the non-conductive state, and in which said capacitance and commutating impedance are located between said unilateral conductor and said first power electrode of said bistable current conductor which they commutate from a conductive to a nonconductive state.

References Cited

UNITED STATES PATENTS

| | | | |
|---|---|---|---|
| 2,925,491 | 2/1960 | Hoeppner et al. | 328—75 XR |
| 3,019,393 | 1/1962 | Rockafellow | 328—130 |
| 3,290,515 | 12/1966 | Procter | 307—223 |

FOREIGN PATENTS

| | | |
|---|---|---|
| 550,128 | 12/1957 | Canada. |

ARTHUR GAUSS, *Primary Examiner.*

STANLEY T. KRAWCZEWICZ, *Assistant Examiner.*

U.S. Cl. X.R.

307—305, 242, 294; 328—75, 130; 315—323; 219—114